(12) United States Patent
Yahata et al.

(10) Patent No.: US 7,723,743 B2
(45) Date of Patent: May 25, 2010

(54) SEMICONDUCTOR LIGHT EMITTING ELEMENT

(75) Inventors: Kosuke Yahata, Aichi-ken (JP); Koichi Goshonoo, Aichi-ken (JP); Miki Moriyama, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 0 days.

(21) Appl. No.: 11/730,565

(22) Filed: Apr. 2, 2007

(65) Prior Publication Data

US 2007/0246735 A1    Oct. 25, 2007

(30) Foreign Application Priority Data

Apr. 3, 2006  (JP) .............................. 2006-101533
Jan. 23, 2007  (JP) .............................. 2007-012703

(51) Int. Cl.
     *H01L 33/00*    (2006.01)
(52) U.S. Cl. ................................. 257/98; 257/E33.068

(58) Field of Classification Search .................... 257/79, 257/99, E33.063, E33.064, 98, E33.067, 257/E33.068
See application file for complete search history.

(56) References Cited

U.S. PATENT DOCUMENTS

| 5,804,918 | A | * | 9/1998 | Yazawa et al. | 313/506 |
| 6,620,720 | B1 | * | 9/2003 | Moyer et al. | 438/612 |
| 6,841,802 | B2 | * | 1/2005 | Yoo | 257/98 |
| 2005/0104080 | A1 | * | 5/2005 | Ichihara et al. | 257/98 |
| 2006/0081868 | A1 | * | 4/2006 | Kotani | 257/99 |
| 2006/0154393 | A1 | * | 7/2006 | Doan et al. | 438/26 |

FOREIGN PATENT DOCUMENTS

JP    2003-347487    12/2003
JP    2006-108161    4/2006

* cited by examiner

*Primary Examiner*—Lynne A Gurley
*Assistant Examiner*—Colleen A Matthews
(74) *Attorney, Agent, or Firm*—McGinn IP Law Group PLLC

(57) ABSTRACT

A semiconductor light emitting element has an electrode formed on a semiconductor layer, a passivation film covering a part of a top surface of the electrode, and a multilayer film formed on the electrode. The multilayer film has at least one pair of a Ti layer and a Ni layer, the Ti layer and the Ni layer being stacked alternately in the multilayer film.

12 Claims, 9 Drawing Sheets

SEMICONDUCTOR LIGHT EMITTING ELEMENT

The present application is based on Japanese patent application Nos. 2006-101533 and 2007-012703, the entire contents of which are incorporated herein by reference.

BACKGROUND OF THE INVENTION

1. Field of the Invention

This invention relates to a semiconductor light emitting element and, in particular, to an improvement in electrodes of a semiconductor light emitting element.

2. Description of the Related Art

Conventionally, a gold bump (Au bump) is often used to bond the electrode of a semiconductor light emitting element to a submount etc. However, since the Au bump bonding has many problems such as insufficient heat radiation property, the use of gold-tin solder (AuSn solder) has been proposed instead of the Au bump.

In order to obtain a good bonding property, the top of the electrode of a semiconductor light emitting element is formed of gold and the surface of the electrode except a part of the top surface as a bonding region is covered with a passivation film (protective film). When the semiconductor light emitting element thus constructed is bonded through the AuSn solder to the submount, the gold of the AuSn solder and the electrode may diffuse mutually by heat in the bonding to cause a big deformation of the electrode to allow the peeling or breaking of the passivation film. Also, the Sn originating in the AuSn solder may penetrate or diffuse into the electrode to affect the functions of the element.

JP-A-2003-347487 discloses a method that the electrode is provided with a three-layer structure formed of a titanium (Ti) layer, a nickel (Ni) layer and a gold (Au) or silver (Ag) layer in the order starting from the semiconductor layer side so as to prevent the Sn originating in the AuSn solder from diffusing into the electrode not to allow the peeling of the electrode. However, this method is only a measure after the Sn penetrates into the electrode and cannot prevent the penetration of the Sn into the electrode. Thus, it is ineffective for the Sn to penetrate into the top of the electrode in the bonding to cause the deformation of the electrode. Therefore, in case of having the passivation film formed on the surface of the electrode, the peeling or breaking of the passivation film must be caused by the deformation of the electrode even when using the method. Further, the method cannot prevent the penetration of the Sn into the electrode which results in affecting the functions of the element.

In order to block the penetration/diffusion into the electrode of Sn originating in the AuSn solder to prevent the affectation to the passivation film and the functions of the element, it is required (1) that the Sn is not diffused to the interface between the passivation film and the upper face of the electrode, and (2) that the Sn is not diffused to the lower part of the electrode. An effective measure to meet the requirements is to form a barrier layer on the electrode. The barrier layer needs (1) an enhanced barrier effect, (2) a low fabrication cost, and (3) an excellent mass productivity (or difficulty of peeling). Although it is considered effective to thicken the barrier layer to enhance the barrier effect, the thickened barrier layer may cause a crack or peeling due to stress to reduce the mass productivity. Although the barrier effect may be enhanced by using platinum (Pt) with an excellent barrier effect, the fabrication cost will be significantly increased since the Pt is expensive.

SUMMARY OF THE INVENTION

It is an object of the invention to provide a semiconductor light emitting element that has an electrode structure with the excellent barrier effect without increasing the fabrication cost thereof.

The inventors have made researches to find a barrier layer to solve the above problems. At first, in selecting a material composing the barrier layer, they have investigated the penetration property of each material into the Sn. For example, Ni and Ti are selected as a candidate material and the penetration property by the Sn thereof is researched in experimental process as below.

First, a sample is prepared in which an Au layer is formed on a Ni layer, and an AuSn solder is then formed on the Au layer under the same thermal conditions as used in the electrode bonding of a semiconductor light emitting element. Then, when observing a cut surface of the sample by SEM (scanning electron microscope), it is found that the Ni layer is reduced in thickness. This reflects presumably that the penetration of the entire Ni layer is caused by the Sn since the AuSn is likely to react with the Ni (See FIG. 1A).

On the other hand, when like experimental process is conducted for a sample with an Au layer formed on a Ti layer, no change is found in thickness of the Ti layer. Instead, a crack-like defect penetrating the upper surface through the lower surface is observed at a part of the Ti layer. This reflects presumably that the AuSn does not react with the Ti and that the penetration of Sn is caused along defects such as a grain boundary or a pinhole in the Ti layer (See FIG. 1B).

As the result of the above experiments, it is confirmed that the penetration property by the Sn is completely different between Ni and Ti. Based on the result, the inventors presumed that the barrier effect to the penetration/diffusion of the Sn can be enhanced by a barrier layer with a multilayer structure that the Ti layer and the Ni layer are alternately stacked as shown in FIG. 1C. In the barrier layer as shown in FIG. 1C, at first, the uppermost Ni layer prevents the penetration/diffusion of the Sn to the lower layer since the Sn is diffused therein. Thus, the Ni layer serves as a primary barrier to reduce the amount of Sn penetration to the lower layer. Although in the next Ti layer the Sn penetration may be caused along the partial defect, the amount of Sn passing through the Ti layer decreases since the amount of Sn reaching the Ti layer is reduced by the uppermost Ni layer as mentioned above. Then, since only the Sn penetrating along the defects in the Ti layer reaches a Ni layer under the Ti layer, only partial diffusion of the little Sn is caused in the Ni layer as illustrated in FIG. 1C. Thus, in the barrier layer composed as shown in FIG. 1C, the penetration/diffusion of Sn can be discontinued by the alternating barrier effects with different mechanism so as to prevent effectively the Sn penetration to the deep portion of the barrier layer. As explained above, the strong barrier effect can be obtained by the barrier layer with the multilayer structure composed of the Ni layer and the Ti layer formed alternately.

Meanwhile, it is necessarily assumed that the strong barrier effect can be also obtained by a barrier layer other than the barrier layer with the multilayer structure composed of the Ni layer and the Ti layer, for example, a barrier layer with a multilayer structure composed of two kinds of layers (i.e., a layer to prevent the Sn penetration by a diffusion effect as in Ni, and a layer to prevent the Sn penetration by substantially not reacting with the Sn as in Ti) with different penetration property by Sn and stacked alternately.

The invention is devised based on the above knowledge. (1) According to one embodiment of the invention, a semiconductor light emitting element comprises:

an electrode formed on a semiconductor layer;
a passivation film covering a part of a top surface of the electrode; and
a multilayer film formed on the electrode,
wherein the multilayer film comprises at least one pair of a Ti layer and a Ni layer, the Ti layer and the Ni layer being stacked alternately in the multilayer film.

In the above invention (1), the following modifications and changes can be made.

(i) The Ti layer is disposed nearest to the electrode.
(ii) The electrode comprises an Au film on a top thereof.
(iii) The semiconductor light emitting element further comprises: a metal reflecting film formed on the passivation film, wherein the electrode comprises a p-side electrode comprising a transparent conductive film.
(iv) A lowermost layer of the multilayer film formed on the p-side electrode comprises the Ni layer.
(v) The semiconductor light emitting element further comprises: a second passivation film formed between the metal reflecting film and the multilayer film.
(vi) The transparent conductive film comprises indium tin oxide (ITO).
(vii) The metal reflecting film comprises at least one of aluminum, silver, an aluminum alloy and a silver alloy.
(viii) The multilayer film comprises an Au film on a top thereof.
(ix) The multilayer film comprises two to five pairs of a Ti layer and a Ni layer.
(x) The Ti layer comprises a thickness of 0.05 μm to 1 μm, and the Ni layer comprises a thickness of 0.05 μm to 1 μm.
(xi) The multilayer film comprises a thickness of 0.2 μm to 2.0 μm.

Advantages of the Invention

In the invention, the multilayer composed of the Ti layer and the Ni layer stacked alternately with the different Sn diffusion preventing mechanism can serve as a barrier layer to obtain the enhanced barrier effect. Thus, the penetration/diffusion of Sn to the electrode side can be blocked so as to prevent the breaking of the passivation film caused by the diffusion of Sn to the interface between the upper surface of the electrode and the passivation film, and the deformation of the electrode caused by the penetration/diffusion of Sn into the electrode as well as the breaking of the passivation film caused thereby, and the affectation to the function of the light emitting element. Further, by virtue of forming the barrier layer with the multilayer structure, the strong barrier effect can be obtained even when each layer composing the barrier layer is reduced in thickness. By reducing the thickness of each layer composing the barrier layer, stress generated in the barrier layer is reduced to have the barrier layer to prevent the crack or peeling. The semiconductor light emitting element comprising the barrier layer thus composed is suited to mass production. On the other hand, the fabrication cost can be reduced by using the relatively inexpensive Ti and Ni as a material for the multilayer. Thus, the multilayer structure of the barrier layer is also advantageous in fabrication cost.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Light Emitting Element

Figure 1A:
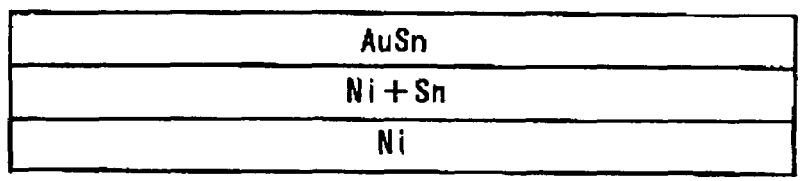
FIG. 1A is a schematic cross sectional view showing a sample composed of a Ni layer with a AuSn solder formed thereon in explaining reactivity between Ni and AuSn.
Figure 1B:
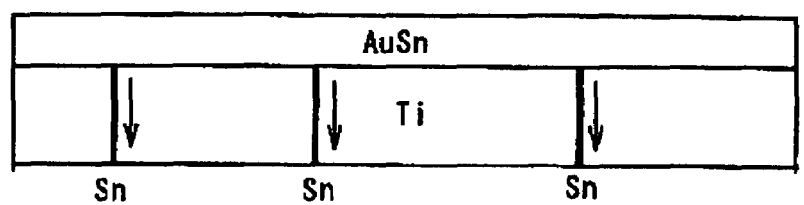
FIG. 1B is a schematic cross sectional view showing a sample composed of a Ti layer with the AuSn solder formed thereon in explaining reactivity between Ti and AuSn.
Figure 1C:
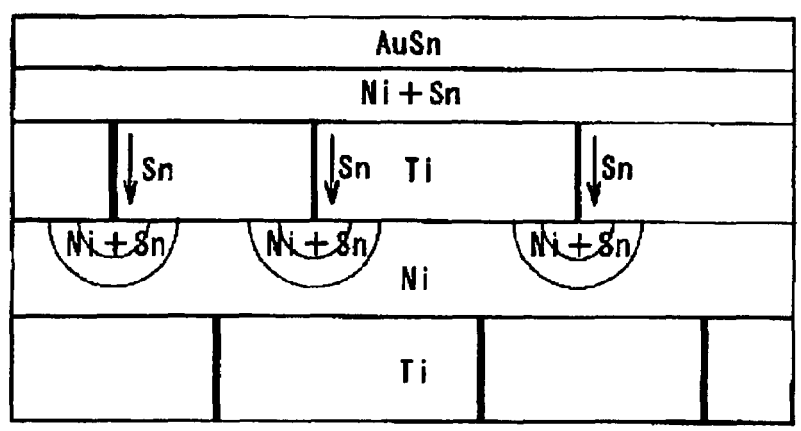
FIG. 1C is a schematic cross sectional view showing a multilayer barrier layer composed of the Ti layer and the Ni layer stacked alternately with the AuSn solder formed on top thereof in explaining a barrier effect thereof.

A semiconductor light emitting element of the invention preferably comprises a group III nitride-based compound semiconductor element with a p-side electrode and an n-side electrode which are formed on the same side. Such a semiconductor light emitting element is used by face-down (or flip-chip) mounting on a submount etc.

The group III nitride-based compound semiconductor element includes a light emitting element with a light emitting layer comprising a group III nitride-based compound semiconductor. The group III nitride-based compound semiconductor can be generally represented as a four-element compound semiconductor by formula: $Al_XGa_YIn_{1-X-Y}N$ ($0 \leq X \leq 1$, $0 \leq Y \leq 1$, $0 \leq X+Y \leq 1$). It also includes a two-element compound semiconductor such as AlN, GaN and InN, and a three-element compound semiconductor such as $Al_XGa_{1-X}N$, $Al_XIn_{1-X}N$ and $Ga_XIn_{1-X}N$ (where $0<X<1$). At least a part of the group III element can be replaced by boron (B), thallium (Tl) etc. At least a part of the nitrogen (N) can be replaced by phosphorus (P), arsenic (As), antimony (Sb), bismuth (Bi) etc. An n-type impurity available includes Si, Ge, Se, Te, C etc. A p-type impurity available includes Mg, Zn, Be, Ca, Sr, Ba etc.

A group III nitride-based compound semiconductor layer thereof can be fabricated by a known method such as MOCVD (metalorganic chemical vapor deposition), MBE (molecular beam epitaxy), HVPE (halides vapor phase epitaxy), sputtering, ion plating, electrode shower etc.

Although the group III nitride-based compound semiconductor layer may be heated by electron irradiation, plasma irradiation or annealing after the p-type impurity is doped, the heating is not always necessary.

Electrode

In a first preferred embodiment of the invention, the upper portion of an electrode of the semiconductor light emitting layer is formed of Au or Al, preferably Au. The electrode has a single layer structure or a multilayer structure. In case of the multilayer structure, at least the uppermost layer thereof is formed of Au. The p-side electrode is formed with a single layer or multilayer structure comprising at least one of a metal such as Au, Rh, Pt, Ag, Cu, Al, Ni, Co, Mg, Pd, V, Mn, Bi, Sn and Re, an alloy thereof, and a transparent conductive material such as ITO, $TiO_2$, $SnO_2$ and ZnO. In particular, Rh and Pt are suitable for a material of the p-side electrode in the group III nitride-based compound semiconductor light emitting element since they have high reflection efficiency to an emission wavelength of the group III nitride-based compound semiconductor light emitting element. On the other hand, the n-side electrode is formed with a single layer or multilayer structure comprising at least one of a metal such as Au, Al, V, Sn, Ti, Ni, Cr, Nb, Ta, Mo, W and Hf, an alloy thereof, and a nitride such as TiN, TaN and WN or a carbide such as TiC, TaC and WC.

The surface of the electrode except a region of the upper surface is covered with a passivation film (i.e., insulating protective film) as explained later. A barrier layer as explained layer is formed on the region (i.e., an opening in the passivation film) not covered with the passivation film. The passivation film is formed of a metal oxide, a metal nitride or glass etc. For example, the passivation film is formed of silicon oxides (e.g., SiO, $SiO_2$ and $Si_xO_y$), silicon nitrides (e.g., SiN, $Si_2N_3$ and $Si_xN_y$), titanium oxides (e.g., TiN, $TiN_2$ and $Ti_xN_y$). The passivation film may be formed of a composite material comprising these materials. Also, the passivation film may be formed with a multilayer structure.

The formation method of the passivation film is not specifically limited, and may be the sputtering, vacuum deposition, preferably plasma CVD.

In a second preferred embodiment of the invention, the p-side electrode of the semiconductor light emitting layer is formed of the transparent conductive film, and a metal reflecting film is formed on the passivation film. In this structure, the metal reflecting film is formed over the transparent conductive film such that a light emitted from the semiconductor layer (i.e., light emitting layer) passes through the transparent conductive film, and is then reflected by the metal reflecting film to cause the light directed to the substrate side.

On the other hand, since in the structure the passivation film is disposed between the transparent conductive film and the metal reflecting film, the interface reaction between the transparent conductive film and the metal reflecting film can be prevented. Thus, reduction in transmissivity of the transparent conductive film and in reflectivity of the metal reflecting film can be prevented to enhance the light extraction efficiency. In feeding a current thereinto, the current is flown only through the contact portion between the barrier layer and the transparent conductive film into the transparent conductive film. Therefore, possibility of occurrence of electromigration in the metal reflecting film can be significantly reduced. In order to further prevent the occurrence of electromigration in the metal reflecting film, the passivation film is preferably formed also between the metal reflecting film and the barrier layer. Especially when the metal reflecting film is formed embedded in the passivation film, the electromigration of metal atom in the metal reflecting film caused by the current flow can be completely prevented to enhance the reliability of the light emitting element.

The transparent conductive film is formed of, e.g., a metal oxide, preferably ITO (indium tin oxide) and ZnO (zinc oxide). The formation method of the transparent conductive film is not specifically limited, and may be the sputtering, vacuum deposition, preferably vacuum deposition by electron beam.

The metal reflecting film can be formed of a metal with a high reflectivity to the light emitted from the semiconductor layer. It is preferably formed of silver (Ag), aluminum (Al), a silver alloy, an aluminum alloy, an alloy including mainly silver and aluminum etc. Especially the aluminum is preferable since it has good adhesiveness to the passivation film. The formation method of the metal reflecting film is not specifically limited, and is preferably the sputtering or vacuum deposition.

Barrier Layer

The barrier layer is formed on the electrode. The barrier layer of the invention is formed with a multilayer film composed of a repeating structure as a pair of a Ti layer and a Ni layer. The barrier layer is preferably structured such that the Ti layer is situated nearer the electrode in relation to the Ni layer (i.e., they are alternately stacked in order of the Ti layer and the Ni layer from the electrode). Thus, the Ti layer with good adhesiveness to the Au composes the lowermost layer of the barrier layer. When the top of the electrode is formed of Au, the adhesiveness between the electrode and the barrier layer can be enhanced. On the other hand, when the p-side electrode is formed with the transparent conductive film (i.e., in the second embodiment), the barrier layer formed on the p-side electrode is preferably formed with the Ni layer at the lowermost so as to enhance the adhesiveness to the p-side electrode.

An Au layer is preferably formed on the barrier layer. In this case, the top surface of the Au layer becomes the bonding face. In general, since the Au layer is fused with the bonding material (i.e., AuSn solder) by being heated in the bonding, the AuSn layer apparently exists on the barrier layer. Alternately, the AuSn layer may be further formed on the Au layer. In this case, the coating etc. of the AuSn solder in mounting the light emitting element can be omitted to enhance the mounting workability.

The number of the repeating structure to composing the multiplayer film is not specifically limited as long as a high barrier effect can be obtained. The number of the repeating structure is preferably 2 to 5. If the number of the repeating structure is too small, the expected barrier effect cannot be obtained. If the number of the repeating structure is too large, undesirable results will be caused where the fabrication cost increases or the forward voltage (Vf) increases.

Each layer composing the barrier layer is not specifically limited in thickness. Since the barrier layer of the invention is formed with the multilayer structure, each layer thereof can be reduced in thickness. Thereby, stress caused in the barrier layer can be reduced to suppress the occurrence of a crack or peeling in the barrier layer. The thickness of the Ti layer can be set in the range of 0.05 μm to 1 μm. Also, the thickness of the Ni layer can be set in the range of 0.05 μm to 1 μm.

The Ti layers included in the multiplayer film not always have to have the same thickness. Same applies to the Ni layers included therein. For example, the multiplayer film can be structured such that the thickness of a layer increases according as the layer comes near the electrode.

The entire thickness of the multilayer film can be, e.g., in the range of 0.2 μm to 2 μm. The entire thickness of the multiplayer film is preferably in the range of 0.3 μm to 1 μm in order to obtain the high barrier effect and to suppress the increase in the fabrication cost and the forward voltage (Vf).

The barrier layer can have the high barrier effect by using the multilayer structure that the Ti layer and the Ni layer with different penetration property to Sn are stacked alternately. Alternatively, when a layer (herein called "first layer") to prevent the penetration of Sn by the diffusion effect as in Ni and a layer (herein called "second layer") to prevent the penetration of Sn by substantially being not reacted with the Sn as in Ti are alternately stacked to compose a multilayer film, it is assumed that it can have the same barrier effect as the barrier layer with the multilayer structure composed of the Ti layer and the Ni layer. For example, the first layer and the second layer can be formed of a material which has the Sn barrier effect the same as or similar to Ni and a material which has the barrier effect the same as or similar to Ti, respectively, to be selected from scandium (Sc), vanadium (V), chromium (Cr), iron (Fe), cobalt (Co), yttrium (Y), zirconium (Zr), niobium (Nb), molybdenum (Mo), technetium (Tc), rubidium (Ru), rhodium (Rh), palladium (Pd), hafnium (Hf), tantalum (Ta), tungsten (W), rhenium (Re), osmium (Os), iridium (Ir) and platinum (Pt). The barrier layer with the multilayer structure can be composed of the selected materials.

Although the barrier layer of the invention is to be constructed by alternately stacking the layers with different barrier effect to Sn, the first layers to compose the barrier layer not always have to be formed of the same material. Same applies to the second layer. In other words, the first layers can be each composed of different materials, the second layers can be each composed of different materials, and the Ti layer and/or the Ni layer can be used as a part of a layer to compose the barrier layer.

In the bonding, the Au layer formed on the barrier layer is fused with the AuSn solder to be substantially an AuSn layer. Thus, it is preferred that the uppermost layer of the barrier layer in case of subsequently forming the Au layer thereon has a good adhesiveness to the AuSn layer to prevent the peeling during the bonding. When the barrier layer is structured such that the repeating structure of the Ti layer and the Ni layer is stacked with the Ti layer situated nearest to the electrode, the uppermost layer becomes the Ni layer. Since the Ni layer has a good adhesiveness to the AuSn, this structure is effective for preventing the peeling during the bonding. When the barrier layer is structured in the order of the Ni layer and the Ti layer (i.e., the Ni layer situated nearest to the electrode) from the electrode side, the peeling during the bonding can be prevented by adding the Ni layer at the uppermost.

First Embodiment

The preferred embodiments of the invention will be explained below.

Figure 2:
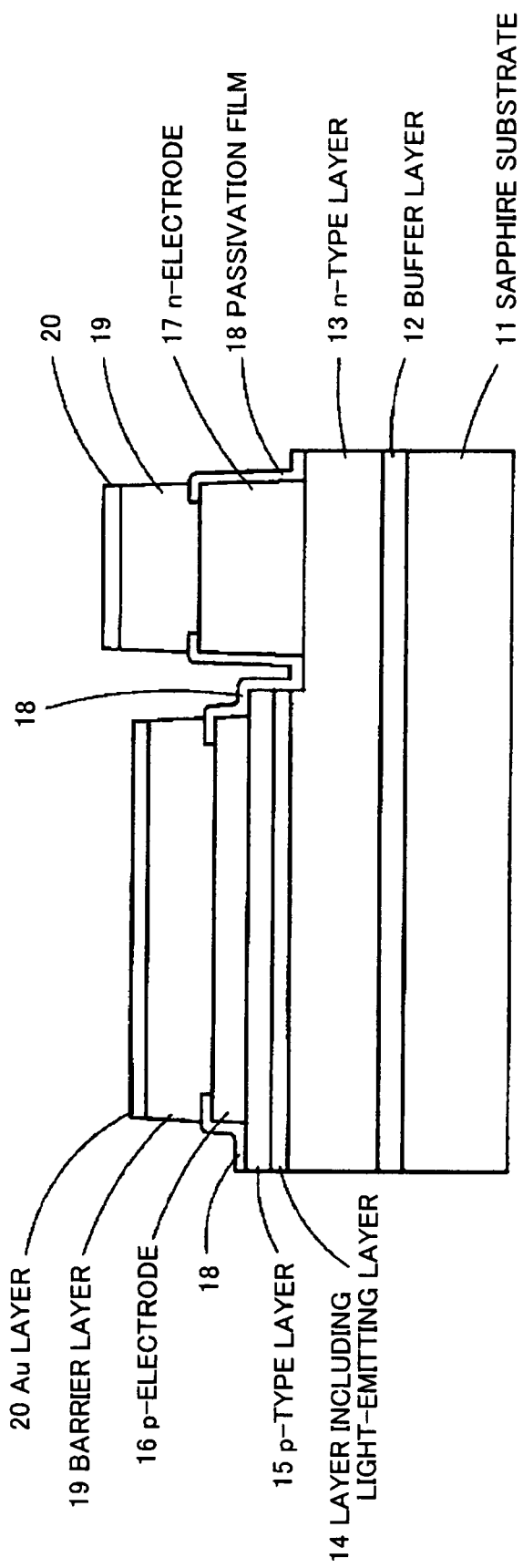
FIG. 2 is a schematic cross sectional view showing a light emitting element 1 in a preferred embodiment of the invention.

FIG. 2 is a schematic cross sectional view showing a light emitting element 1 in the first preferred embodiment of the invention. The specification of the light emitting element 1 is as follows.

Layer: Composition
p-type layer 15: p-GaN:Mg
layer 14 including a light emitting element: including InGaN layer
n-type layer 13: n-GaN:Si
buffer layer 12: AlN
substrate 11: sapphire On the substrate 11, the n-type layer 13 of GaN with Si doped therein as an n-type impurity is formed through the buffer layer 12. The substrate 11 is formed of sapphire, but it can be formed of spinel, silicon, silicon carbide, zinc oxide, gallium phosphide, gallium arsenide, magnesium oxide, manganese oxide, single crystal of group III nitride-based compound semiconductor etc. The buffer layer 12 is formed of AlN by MOCVD, but it can be formed of GaN, InN, AlGaN, InGaN or AlInGaN by MBE, HVPE, sputtering, ion plating or electron shower. When the substrate 11 is formed of a group III nitride-based compound semiconductor, the buffer layer 12 can be omitted. If necessary, the substrate 11 and the buffer 12 may be removed after forming the semiconductor element.

Although in this embodiment the n-type layer 13 is formed of GaN, it may be formed of AlGaN, InGaN or AlInGaN instead of the GaN. The n-type impurity doped into the n-type layer can be Ge, Se, Te, C etc. other than Si.

The n-type layer 13 may be composed of a two-layer structure including a low-electron concentration $n^-$ layer situated on the layer 14 side including the light emitting layer, and a high-electron concentration $n^+$ layer situated on the buffer layer 12 side.

The layer 14 including the light emitting layer may include, on the p-type layer 15 side, a wide-bandgap group III nitride-based compound semiconductor layer doped with an acceptor such as Mg. This is intended to effectively prevent electron injected into the layer 14 to diffuse into the p-type layer 15.

On the layer 14, the p-type layer 15 is formed which is formed of GaN with Mg doped therein as a p-type impurity. The p-type layer 15 may be formed of AlGaN, InGaN or AlInGaN instead of the GaN. The p-type impurity can be Zn, Be, Ca, Sr, Ba etc. The p-type layer 15 may be composed of a two-layer structure including a low-hole concentration $p^-$ layer situated on the layer 14 side, and a high-hole concentration $p^+$ layer situated on the electrode side.

Each of the group III nitride-based compound semiconductor layers to compose the light emitting element can be formed by MOCVD under the general conditions. It may be formed by MBE, HVPE, sputtering, ion plating or electron shower.

After the p-type layer 15 is formed, a part of the p-type layer 15, the layer 14 and the n-type layer 13 is removed by etching to expose a part of the n-type layer 13. Then, a p-side electrode 16 of Rh and Au is formed on the p-type layer 15 by deposition. An n-side electrode 17 is composed of a V layer, an Al layer, a Ti layer, a Ti layer, a Ni layer and an Au layer stacked in this order on the n-type layer 13 by deposition. Then, it is alloyed by the known method.

Then, the passivation film (protective film) 18 of $SiO_2$ is formed partially thereon. The passivation film 18 is formed covering the surface of the semiconductor layer on the side where the electrodes are formed, the side face and the top periphery face of the p-side electrode 16, and the side face and the top periphery face of the n-side electrode 17.

Figure 3:
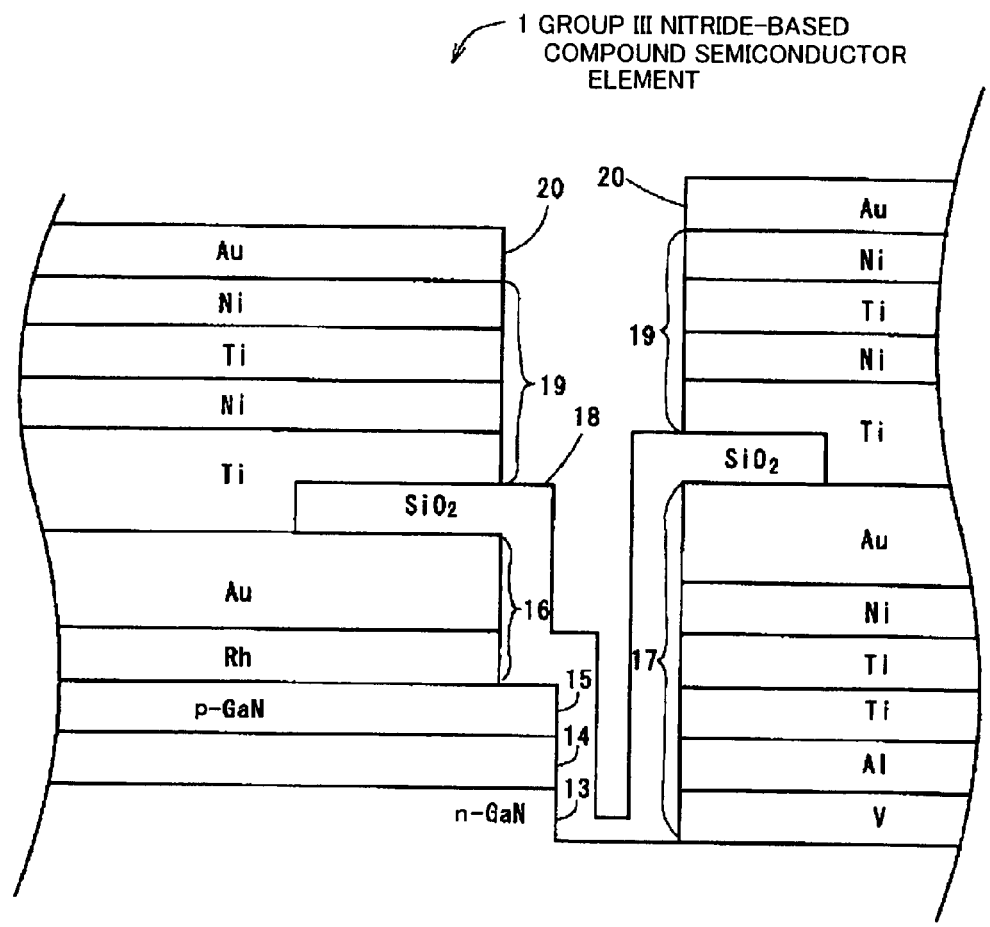
FIG. 3 is a schematic cross sectional view showing a barrier layer composing the light emitting element 1 in FIG. 2.

Then, a barrier layer 19 is formed on each electrode. At first, a region except the formation region of the barrier layer 19 is masked with a resist. The formation region of the barrier layer 19 is an opening on the top face of each electrode, and a periphery of the passivation film 18 forming the opening as shown in FIG. 2. As shown in FIG. 3, the barrier layer 19 is composed of the Ti layer and the Ni layer stacked alternately, and formed as below. At first, the Ti layer with a predetermined thickness is deposited (e.g., by EB deposition or sputtering) on a region not masked with the resist. Then, the Ni layer with a predetermined thickness is formed likewise on the Ti layer. The formation of the Ti layer and the Ni layer is repeated by necessary times or cycles (e.g., 1 to 5 times or cycles). In this embodiment, the formation of each layer is conducted twice. Thus, as shown in FIG. 3, the barrier layer 19 can be formed which is 2 in the number of the repeating structures of the Ti layer and the Ni layer. The thickness of each layer stacked from the electrode side is 0.15 μm (Ti layer), 0.1 μm (Ni layer), 0.15 μm (Ti layer) and 0.1 μm (Ni layer).

After the barrier layer 19 is formed, a 0.5 μm thick Au layer 20 is formed on the barrier layer 19 by deposition. Then, a wafer thus fabricated is cut into chips by using a scriber etc.

An example of a light emitting device (i.e., an LED lamp) produced by using the light emitting element will be explained below.

Figure 4:
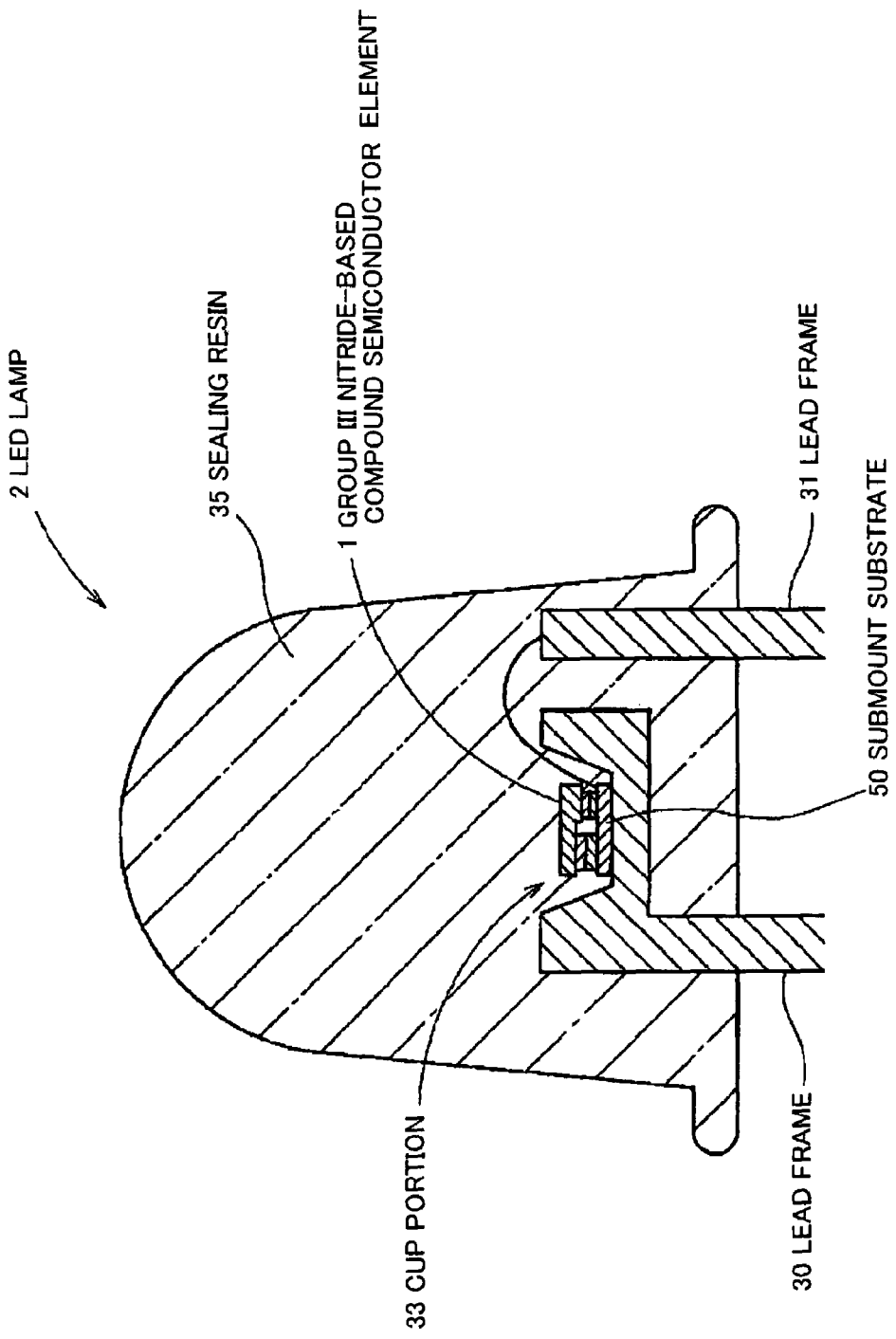
FIG. 4 is a schematic cross sectional view showing an LED lamp 2 with the light emitting element 1 in FIG. 2.

FIG. 4 is a schematic cross sectional view showing an LED lamp 2 with the light emitting element 1 in FIG. 2 built therein.

The LED lamp 2 is mainly composed of the light emitting element 1, lead frames 30, 31, a submount substrate 50 and a sealing resin 35.

The mounting process of the light emitting element 1 will be explained below referring to FIG. 5 which shows an enlarged cup portion 33 of the lead frame 30 in FIG. 4.

The light emitting element 1 is mounted through the submount 50 on the cup portion 33 of the lead frame 30. As shown in FIG. 5, the submount substrate 50 is composed of a p-type region 51 and an n-type region 52, and an insulating film 60 of $SiO_2$ is formed on the top surface except the bonding region. The light emitting element 1 is flip-chip mounted (or bonded) on the submount substrate 50 through an AuSn solder. Thereby, the p-side electrode 16 is bonded through the AuSn layer 21 and the barrier layer 19 to the p-type region 51 of the submount substrate 50, and the n-side electrode 17 is bonded through the AuSn layer 21 and the barrier layer 19 to the n-type region 52 of the submount substrate 50. In the bonding, the Au layer 20 formed on the barrier layer 19 is fused with the AuSn solder to allow the diffusion of Sn into the barrier layer 19. However, the barrier layer 19 with the Ti layer and the Ni layer with different Sn diffusion-preventing mechanism stacked alternately serves to prevent the penetration/diffusion of the Sn into the electrode by the high barrier effect. Thus, the breaking of the passivation film 18 caused by the Sn diffusion into the interface between the top face (i.e., the Au layer) of each electrode and the passivation film 18, the deformation of each electrode caused by the penetration/diffusion of the Sn into each electrode, and the breaking of the passivation film 18 and the affectation to the functions of the light emitting element caused thereby can be effectively prevented.

As mentioned above, the Au layer 20 formed on the barrier layer 19 is fused with the AuSn solder. As a result, the AuSn layer 21 is formed between the barrier layer 19 and the submount substrate 50 after the bonding (See FIG. 5). As shown in FIG. 3, the uppermost layer of the barrier layer 19 is the Ni layer which has a good adhesiveness with the AuSn layer 21. Therefore, the peeling from the submount substrate 50 can be prevented even after the bonding.

The submount substrate 50 is bonded and fixed to the cup portion 33 of the lead frame 30 through a silver paste 61 on the opposite side to the side where to mount the light emitting element 1. Then, by conducting the steps of wire bonding and sealing, the LED lamp 2 as shown in FIG. 4 can be obtained.

Second Embodiment

Figure 6:
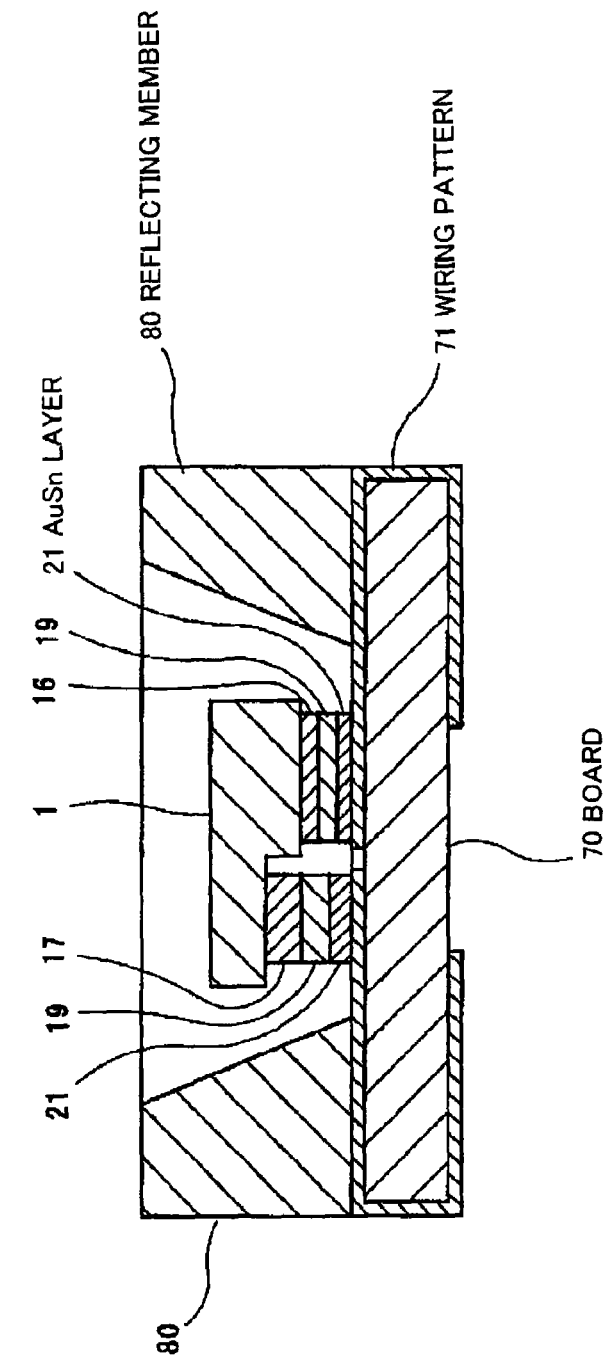
FIG. 6 is a schematic cross sectional view showing an SMD-type LED lamp 3 with the light emitting element 1.

FIG. 6 is a schematic cross sectional view showing an SMD-type LED lamp 3 with the light emitting element 1. In FIG. 6, like components are indicated by the same numerals as used for the LED lamp 2.

The LED lamp 3 is composed of the light emitting element 1, a board 70 and a reflecting member 80. The light emitting element 1 is flip-chip mounted through the AuSn solder on the board 70 while facing the electrodes downward in the same way as the LED lamp 2. The board 70 is provided with a wiring pattern 71 on the surface. The electrical connection of each electrode is established by bonding the wiring pattern 71 through the barrier layer 19 and the AuSn layer 21 to the p-side electrode and the n-side electrode 17 of the light emitting element 1. The reflecting member 80 is disposed on the board 70 while surrounding the light emitting element 1. The reflecting member 80 is formed of a whitish resin and can efficiently reflect a light emitted from the light emitting element 1 on the surface.

Third Embodiment

Figure 7:
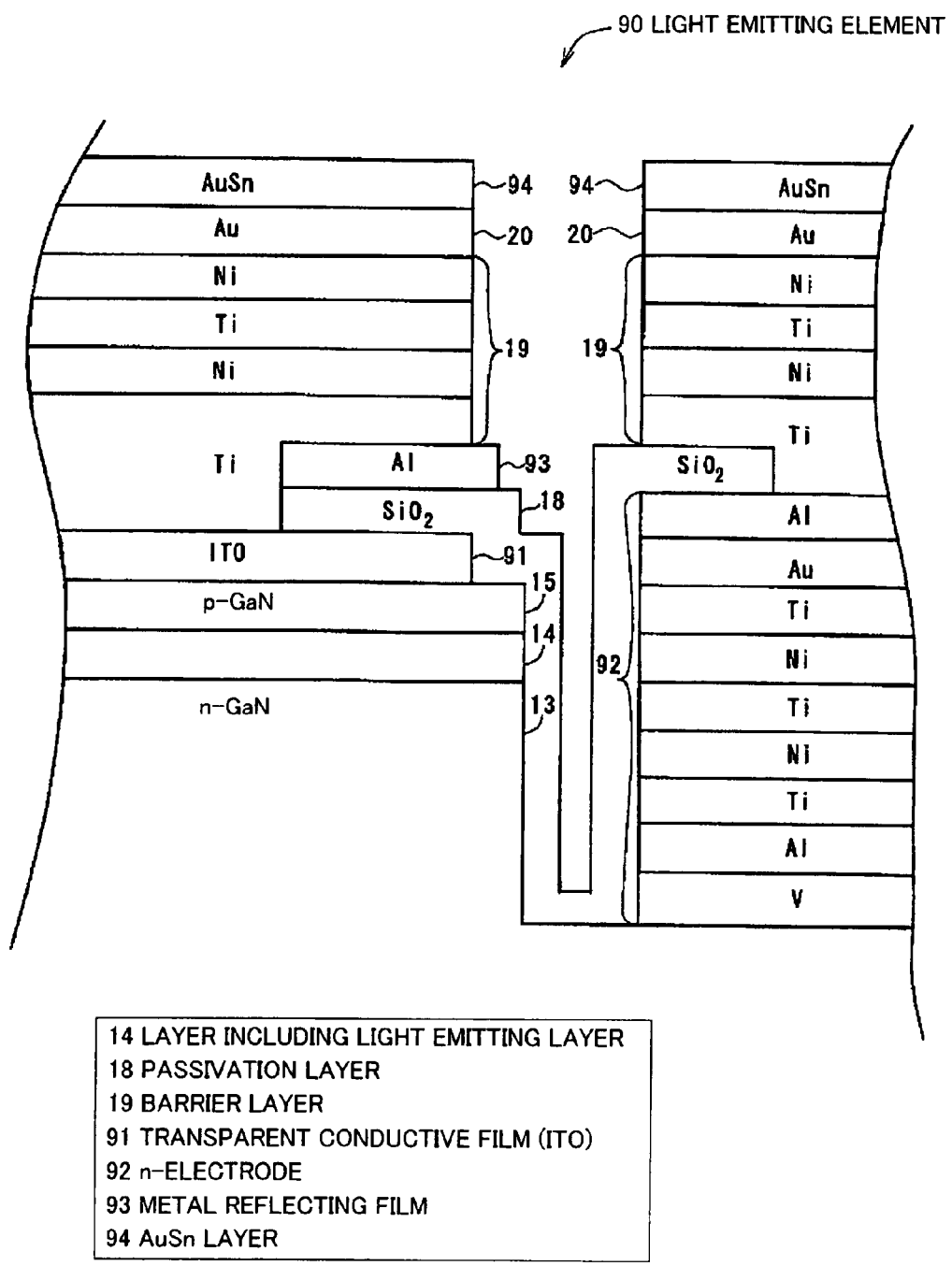
FIG. 7 is a schematic cross sectional view showing an electrode of a light emitting element 90 in another preferred embodiment of the invention.

FIG. 7 is a schematic cross sectional view showing an electrode of a light emitting element 90 in the third preferred embodiment of the invention.

The composition of semiconductor layers in the light emitting element 90 is the same as the light emitting element 1 as mentioned in the first and second embodiments.

Figure 5:
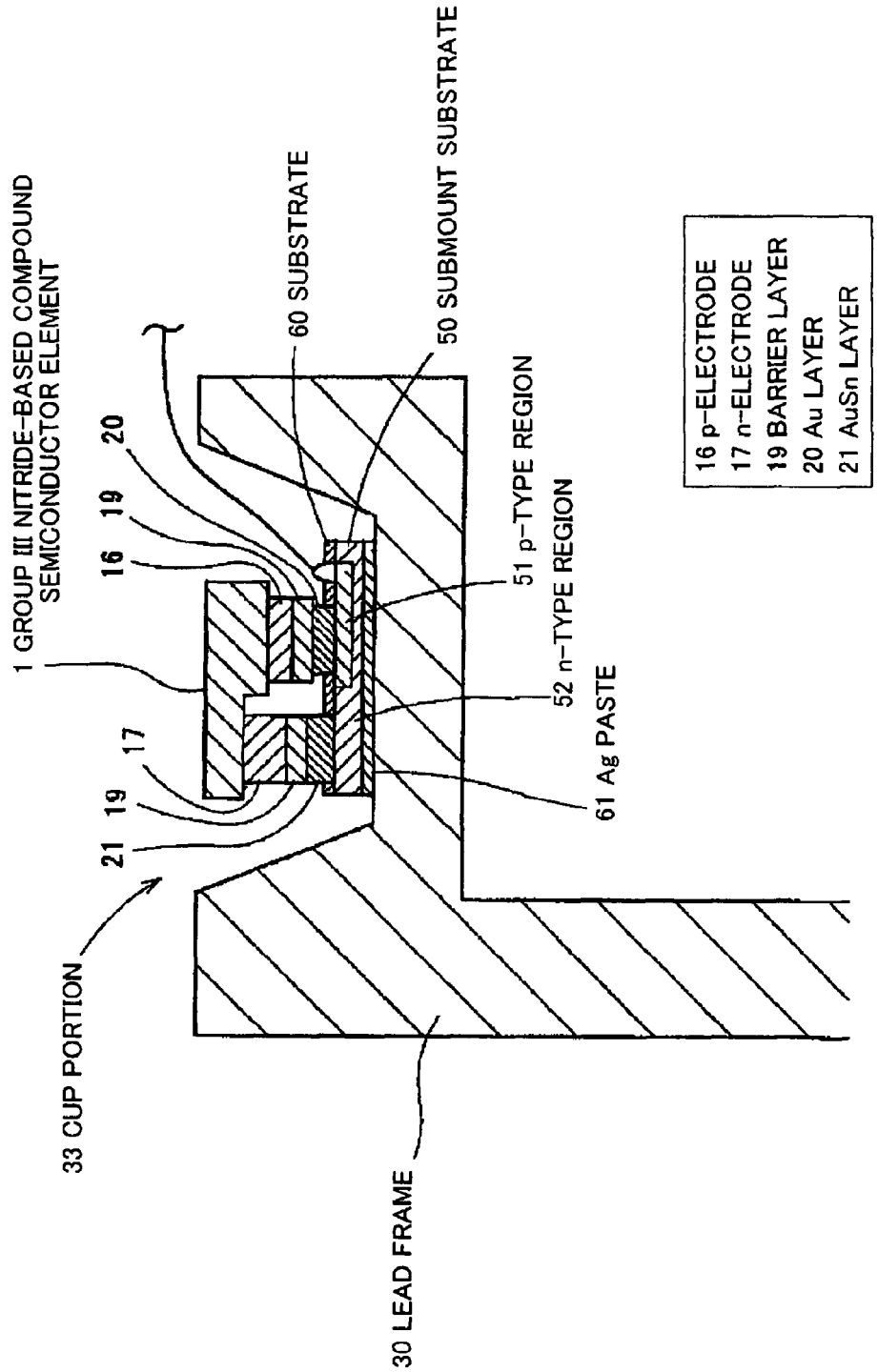
FIG. 5 is a schematic enlarged cross sectional view showing a part of the LED lamp 2 in FIG. 4.

The light emitting element 90 is face-down or flip-chip mounted (as shown in FIGS. 4 to 6) like the light emitting element 1. The features of the light emitting element 90 will be explained below referring to FIG. 7. In FIG. 7, like components are indicated by the same numerals as used in the above embodiments (i.e., light emitting element 1).

The light emitting element 90 is provided with a transparent conductive film 91 of ITO as the p-side electrode. The transparent conductive film 91 of ITO is formed on the p-type layer 15 by MOCVD. On the other hand, an n-side electrode 92 is formed by deposition which is composed of a V layer, an Al layer, a Ti layer, a Ni layer, a Ti layer, a Ni layer, a Ti layer, an Au layer and an Al layer stacked in this order from the side of the n-type layer 13.

As shown in FIG. 7, the passivation film 18 ($SiO_2$) is formed such that it covers the surface of the semiconductor layer on the side where the electrodes are formed, the side face and the top periphery face of the transparent conductive film 91, and the side face and the top periphery face of the n-side electrode 92, while exposing a part of the transparent conductive film 91 and the n-side electrode 92. A metal reflecting film 93 of Al is formed on the passivation film 18. Thus, the metal reflecting film 93 of Al is formed over the transparent conductive film 91. Therefore, the passivation film 18 disposed between the transparent conductive film 91 and the metal reflecting film 93 can prevent the interface reaction to be caused between the transparent conductive film 91 and the metal reflecting film 93, and the occurrence of electromigration of metal atom (Al) in the metal reflecting film 93.

Figure 8:
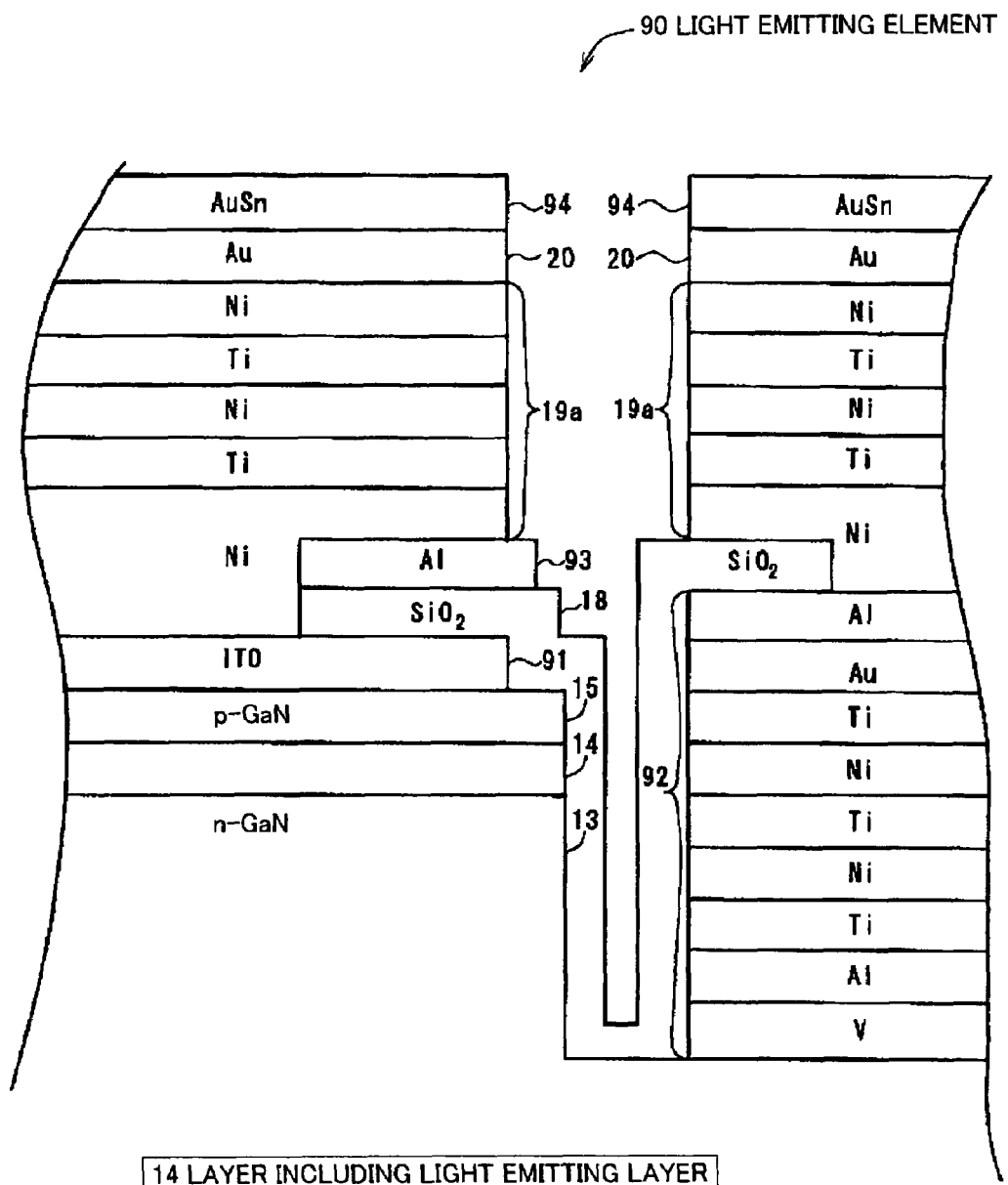
FIG. 8 is a schematic cross sectional view showing a modification of the electrode of the light emitting element 90 in FIG. 7.

After the metal reflecting film 93 is formed, the barrier layer 19 is formed on each electrode. The formation method of the barrier layer 19 in this embodiment is the same as the above embodiments (i.e., that used for the light emitting element 1). Although in this embodiment the barrier layer 19 is composed of a Ti layer, a Ni layer, a Ti layer and a Ni layer stacked in this order from the side of the electrode, another barrier layer 19a with a Ni layer at the lowermost as shown in FIG. 8 may be formed on the transparent conductive film 91. The barrier layer 19a is, as shown in FIG. 8, composed of a Ni layer, a Ti layer, a Ni layer, a Ti layer and a Ni layer stacked in this order from the side of the electrode, so that it can have a further enhanced adhesiveness to the transparent conductive film 91.

After the Au layer 20 and an AuSn layer 94 are formed by deposition, a wafer thus fabricated is cut into chips by using a scriber etc. The AuSn layer 94 is previously formed in order to omit the process of coating etc. of the AuSn solder in the mounting of the light emitting element.

The light emitting element 90 thus fabricated operates such that a light passing through the transparent conductive film 91 and then traveling upward is reflected by the metal reflecting film 93 to cause a light directed to the substrate 11 side. As compared to light output of the light emitting element 1 of the first embodiment, it is confirmed that light output of the light emitting element 90 is increased by about 40%.

Fourth Embodiment

Figure 9:
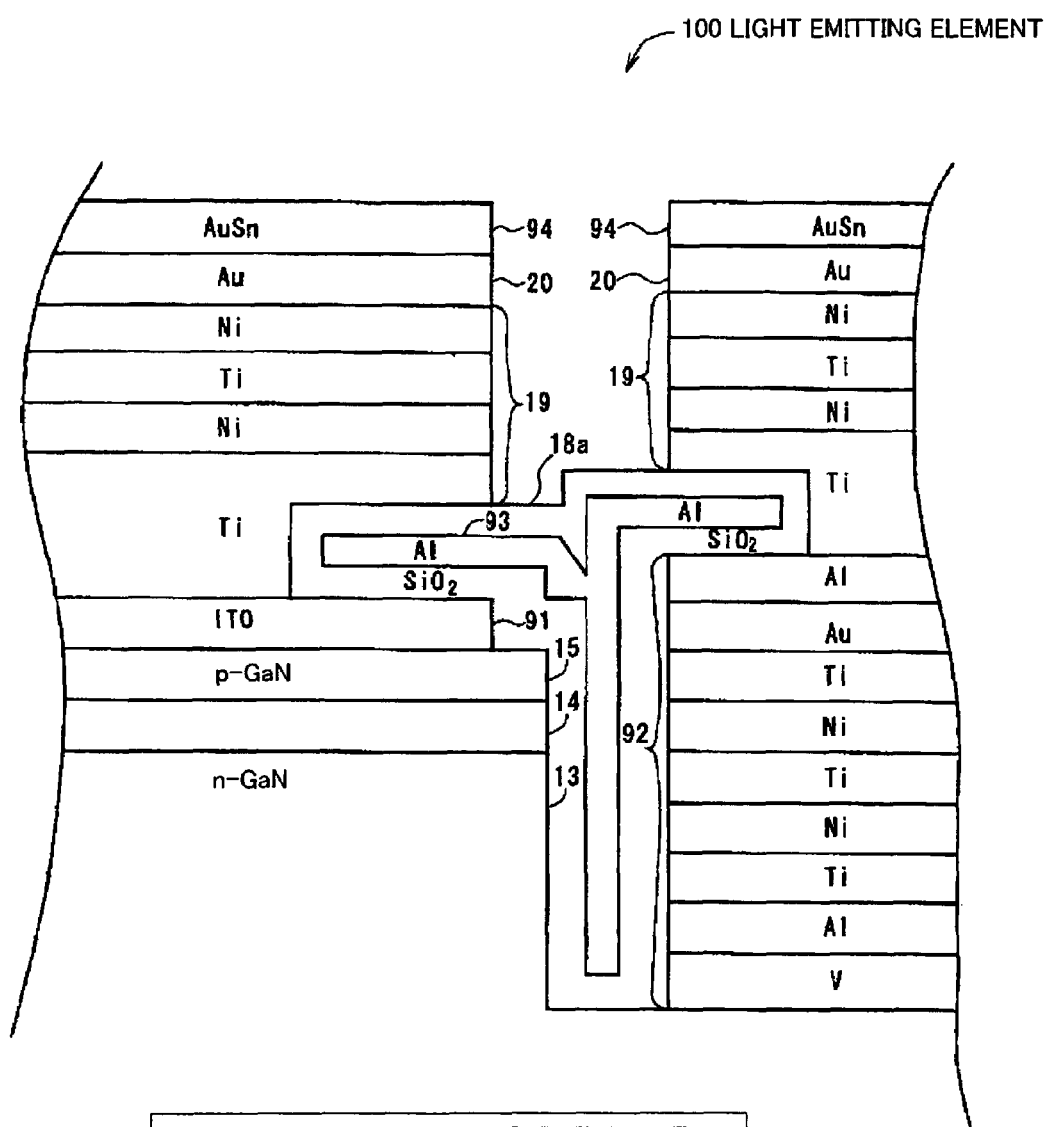
FIG. 9 is a schematic cross sectional view showing an electrode of a light emitting element 100 in a further preferred embodiment of the invention.

FIG. 9 is a schematic cross sectional view showing an electrode of a light emitting element 100 in the fourth preferred embodiment of the invention. In FIG. 9, like components are indicated by the same numerals as used for the light emitting element 90.

The light emitting element 100 is provided with the transparent conductive film 91 and the metal reflecting film 93 like the light emitting element 90. However, the metal reflecting film 93 is completely covered with the passivation film 18a (i.e., the metal reflecting film 93 is embedded in the passivation film 18a).

In the fabrication process of the light emitting element 100, after the metal reflecting film 93 is formed, another passivation film (or a second passivation film) is formed to cover the metal reflecting film 93 completely.

The light emitting element 100 can completely prevent the electromigration of metal atom (Al) in the metal reflecting film 93 since current is not flown through the metal reflecting film 93. Thereby, the electrical characteristics of the light emitting element 100 can be stabilized to enhance the reliability.

INDUSTRIAL APPLICABILITY

The invention can be applied to, other than the semiconductor light emitting element, another semiconductor element such as an optical semiconductor element, a high-output semiconductor element and a high-frequency semiconductor element with a passivation film and, especially, to an electrode structure thereof when being mounted by using the AuSn solder.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor light emitting element, comprising:
   an electrode formed on a semiconductor layer formed on a substrate, the electrode comprising a transparent conductive film;
   a passivation film covering a part of a top surface of the electrode;
   a multilayer film formed on the electrode; and
   a metal reflecting film embedded in the passivation film such that a current is not flown through the metal reflecting film,
   wherein the multilayer film comprises:
      a Ti layer as a lowermost layer of the multilayer film; and
      a primary barrier layer formed directly on the Ti layer, the primary barrier allowing a diffusion of Sn, and
   wherein light emitted in the semiconductor layer passes through the transparent film and is reflected by the metal reflecting film toward a side of the substrate.

2. The semiconductor light emitting element according to claim 1, wherein the electrode comprises an Au film on a top thereof.

3. The semiconductor light emitting element according to claim 1, wherein the multilayer film comprises an Au film on a top thereof.

4. The semiconductor light emitting element according to claim 1, wherein the multilayer film comprises a thickness of 0.2 μm to 2.0 μm.

5. The semiconductor light emitting element according to claim 1, wherein the primary barrier layer comprises a Ni layer.

6. The semiconductor light emitting element according to claim 2 wherein the multilayer film comprises two to five pairs of a Ti layer and a Ni layer.

7. The semiconductor light emitting element according to claim 5, wherein the Ti layer comprises a thickness of 0.05 μm to 1 μm, and the Ni layer comprises a thickness of 0.05 μm to 1 μm.

8. The semiconductor light emitting element according to claim 1, wherein the metal reflecting film is electrically insulated.

9. The semiconductor light emitting element according to claim 8, further comprising a transparent conductive film formed between the passivation film and the metal reflecting film, the transparent conductive film comprising indium tin oxide (ITO).

10. The semiconductor light emitting element according to claim 8, wherein the metal reflecting film comprises at least one of aluminum, silver, an aluminum alloy and a silver alloy.

11. A semiconductor light emitting element, comprising:
    an electrode formed on a semiconductor layer layer formed on a substrate, the electrode comprising a transparent conductive film;
    a passivation film covering a part of a top surface of the electrode;
    a multilayer film formed on the electrode; and
    a metal reflecting film embedded in the passivation film such that a current is not flown through the metal reflecting film,
    wherein the multilayer film comprises a diffusion preventing layer preventing diffusion of Sn, and a primary barrier layer formed directly on the diffusion preventing layer, the primary barrier layer allowing diffusion of Sn, and
    wherein light emitted in the semiconductor layer passes through the transparent film and is reflected by the metal reflecting film toward a side of the substrate.

12. The semiconductor light emitting element according to claim 11, wherein the metal reflecting film is electrically insulated.

* * * * *